United States Patent [19]
Chu et al.

[11] Patent Number: 6,002,271
[45] Date of Patent: Dec. 14, 1999

[54] DYNAMIC MOS LOGIC CIRCUIT WITHOUT CHARGE SHARING NOISE

[75] Inventors: Sam Gat-Shang Chu; Visweswara Rao Kodali; Michael Ju Hyeok Lee, all of Austin, Tex.

[73] Assignee: International Business Machines Corporation, Armonk, N.Y.

[21] Appl. No.: 08/854,368

[22] Filed: May 12, 1997

[51] Int. Cl.[6] ................................................ H03K 19/096
[52] U.S. Cl. ............................................. 326/98; 326/121
[58] Field of Search ................................. 326/95, 98, 121, 326/119, 27, 28, 112

[56] References Cited

U.S. PATENT DOCUMENTS

| | | | |
|---|---|---|---|
| 4,700,086 | 10/1987 | Ling et al. | 326/121 |
| 5,530,380 | 6/1996 | Kondoh | 326/98 |
| 5,793,228 | 8/1998 | Evans | 326/98 |

*Primary Examiner*—Jon Santamauro
*Assistant Examiner*—Don Phu Le
*Attorney, Agent, or Firm*—Kelly K. Kordzik; Winstead Sechrest & Minick P.C.; Anthony V. S. England

[57] ABSTRACT

Circuitry for eliminating charge sharing noise in MOS dynamic logic circuits is described. Dynamic logic circuits having stacks of MOS devices controlling the state of a common node defining the output logic state of the circuit are susceptible to charge sharing noise. This noise ultimately arises from leakage and stray capacitances at the nodes between MOS devices in each stack which the common node must supply. The noise is eliminated by employing MOS devices associated with the MOS devices in the stacks to couple the nodes between stack MOS devices to a supply voltage until their associated stack device changes logic state. On the changing state of the associated stack device, the node charging MOS device turns off, allowing the nodes to assume states defined by the input signals to the dynamic logic circuit.

14 Claims, 5 Drawing Sheets

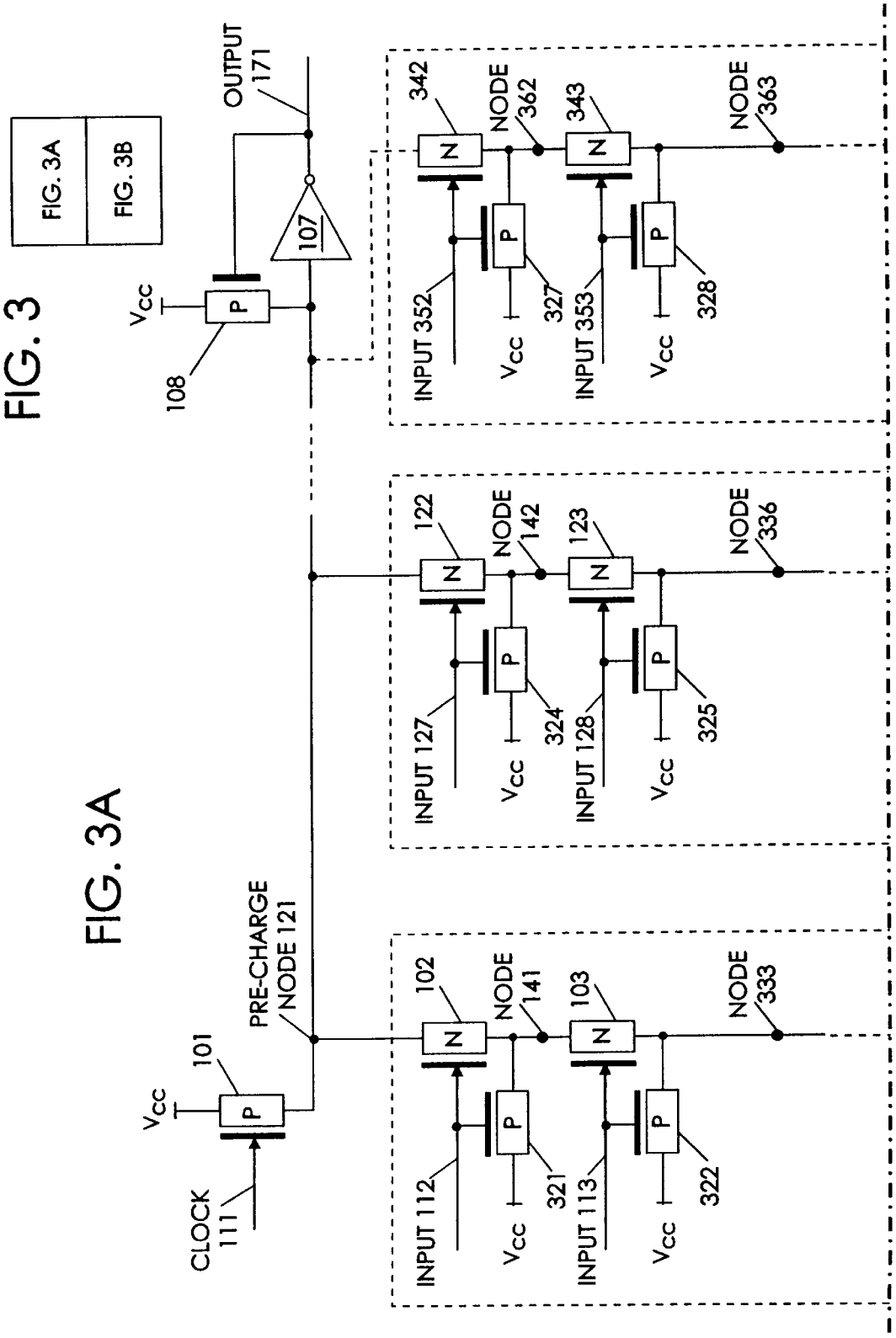

६,००२,२७१

DYNAMIC MOS LOGIC CIRCUIT WITHOUT CHARGE SHARING NOISE

TECHNICAL FIELD

The present invention relates in general to logic circuitry, and in particular, to metal-oxide semiconductor ("MOS") dynamic logic circuits.

BACKGROUND INFORMATION

Dynamic logic circuits in which the output state is determined during an evaluate phase of a clock signal are susceptible to charge sharing noise. In such logic circuits, the output logic state of the circuit is controlled by stacks of MOS devices which drain charge from a common node during the evaluation phase of operation of the circuit. The state of each stack of devices is determined by the inputs to the MOS devices comprising the stack. The noise results from the sharing of charge on the common node among the stacks of MOS devices. If the charge drained from the common node is sufficiently large, the output logic state may switch even though the input logic states are such that the output logic state would not otherwise switch in the absence of these parasitic effects. This may be better understood by now referring to FIG. 1 which typifies such a dynamic logic circuit.

Clock input 111 is applied to the gate of P-type MOS device 101. The source of MOS device 101 is coupled to a supply voltage, Vcc, and the drain of MOS device 101 is coupled to the input 117 of inverter 107. The output of inverter 107 forms the output 171 of the dynamic logic circuit 100. P-type MOS device 108 comprises a weak latch which latches the logic state of the input 117 of inverter 107. The junction between the drain of MOS device 101 and MOS device stacks 131 and 132 forms pre-charge node 121. The input 117 of inverter 107 is also connected to pre-charge node 121. MOS device stacks 131 and 132 are in parallel between pre-charge node 121 and ground.

The state of pre-charge node 121 depends on the logic states of the inputs to MOS devices 102, 103, 122, and 123. When the logic level of clock 111 is low, defining the pre-charge phase, MOS device 101 conducts, charging pre-charge node 121, and therefore the input 117 of inverter 107, to a high logic state. At the same time, the low logic level of clock 111 turns off clock foot MOS devices 104 and 105. This lifts MOS device stack 131 and MOS device stack 132 from ground. Therefore, pre-charge node 121 is charged to approximately Vcc during the low logic level of clock 111 independent of the input states of MOS devices 102, 103, 122, and 123.

The evaluate phase begins when clock 111 transitions from low to high. This turns off MOS device 101 and turns on clock foot MOS devices 104 and 105. This couples to ground the series strings of MOS devices 102 and 103 in MOS device stack 131, and MOS devices 122 and 123 in MOS device stack 132.

The state of pre-charge node 121 is determined by the logic signals applied to MOS devices 102, 103, 122, and 123 at their respective inputs 112, 113, 127, and 128. For example, in dynamic logic circuit 100, if input 112 and input 113 are both logic level high, MOS device 102 and MOS device 103 both conduct, discharging pre-charge node 121 to ground thereby forming a logic level low at the input 117 of inverter 107. The output 171 of dynamic logic circuit 100 would then be high. Likewise, if the logic levels of input 127 and input 128 are both high, then MOS device stack 132 would shunt pre-charge node 121 to ground, resulting in a logic high at the output 171 of dynamic logic circuit 100. Conversely, if either of the inputs 112 and 113 in MOS device stack 131, and inputs 127 or 128 in MOS device stack 132 are low, then neither MOS device stack 131 nor MOS device stack 132 has a conducting path to ground and pre-charge node 121 remains charged to a high logic level. Consequently, the output 171 of dynamic logic circuit 100 would remain at a low logic level.

It is an important requirement of the dynamic logic circuit 100 that the evaluate phase persists throughout the high state of clock 111. This means that the logic levels of inputs 112, 113, 127, and 128 may, and must be allowed to, attain their dynamic logic levels at any time during the high logic level state of clock 111 comprising a particular evaluate phase. The changing of the states of inputs 112, 113, 127, and 128 during the evaluate phase, coupled with real circuit effects, can give rise to noise in the operation of dynamic logic circuit 100.

If, in the evaluate phase, input 113 of MOS device 103 and input 128 of MOS device 123 are low and remain low, pre-charge node 121 should remain charged to a high logic level independent of the states of inputs 112 and 127. This is in accordance with the operation described above. However, if, during the evaluate phase, input 112 of MOS device 102 transitions from low to high, and input 127 of MOS device 122 also transitions from low to high, then both MOS device 102 and MOS device 122 turn on. Node 141 and node 142 are then both connected to pre-charge node 121. Due to stray capacitances, the charge on pre-charge node 121 divides between node 141 and node 142. This may reduce the charge on pre-charge node 121 to a level that is sufficiently low to cause the output 171 of dynamic logic circuit 100 to falsely switch. In order to overcome this effect, the dynamic logic circuit 200 of FIG. 2 has been employed.

Referring now to FIG. 2, it will be seen that dynamic logic circuit 200 employs circuitry to pre-charge any stray capacitances of node 141 and node 142. During the pre-charge phase, at which time pre-charge node 121 is charged through MOS device 101 by virtue of clock 111 being at a low logic level, clock 111 is also provided to the gates of MOS device 201 and MOS device 202. Thus, MOS devices 201 and 202 are turned on, thereby charging node 141 and node 142, respectively, to approximately Vcc. After the evaluate phase commences on the transition of clock 111 to a high logic level, ideally, node 141 and node 142 retain their pre-charge. In this circumstance, even if input 112 of MOS device 102 and input 127 of MOS device 122 transition from low to high during the evaluate phase while input 113 of MOS device 103 and input 128 of MOS device 123 remain low, pre-charge node 121 will not discharge into node 141 and node 142 because any stray capacitances associated with those nodes have been pre-charged. However, the requirement that inputs 112, 113, 127, and 128 be allowed to assume their logic levels at any time during the evaluate phase, can cause the solution embodied in dynamic logic circuit 200 to be ineffective in eliminating noise in the operation of dynamic logic circuit 200.

If, during the evaluate phase, the low to high transition of input 112 of MOS device 102 and input 127 of MOS device 122 are sufficiently delayed relative to the beginning of the evaluate phase, then a false switching of the output of logic circuit 200 may still occur. In this circumstance, leakage can drain the pre-charge from node 141 and node 142 before the low to high transition of input 112 and input 127. Then, the pre-charge on node 121 will still be required to charge any stray capacitances of node 141 and 142, and the charge sharing that gave rise to the noise in the operation of dynamic logic circuit 100 of FIG. 1 will reappear. Consequently, dynamic logic circuit 200 is also susceptible to charge sharing noise. Therefore, there remains a need in the art for dynamic logic circuitry which eliminates charge sharing noise.

SUMMARY OF THE INVENTION

The previously mentioned need is fulfilled by the present invention. The present invention satisfies the foregoing requirement for dynamic logic circuitry without charge sharing noise by the addition of complementary MOS devices to the source side of all MOS devices in a stack receiving input signals, provided the succeeding MOS device in the stack also receives an input signal. The drain of the complementary MOS device is connected to the source of its associated stack MOS device, and the gate of the complementary MOS device is connected to the input of its associated stack MOS device. The source of the complementary MOS device is connected to a supply voltage Vcc. Thus, the nodes between stack devices have a constant voltage of approximately Vcc applied to them until the switching of the input of the stack MOS device whose source forms the node. In this way, charge sharing noise is eliminated independent of the delay between initiation of the evaluate phase and the input signal transitions. This overcomes the deficiency in the prior art whereby a node discharges in the time interval between the initiation of the evaluate phase and the switching of an input to one of the stack devices.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
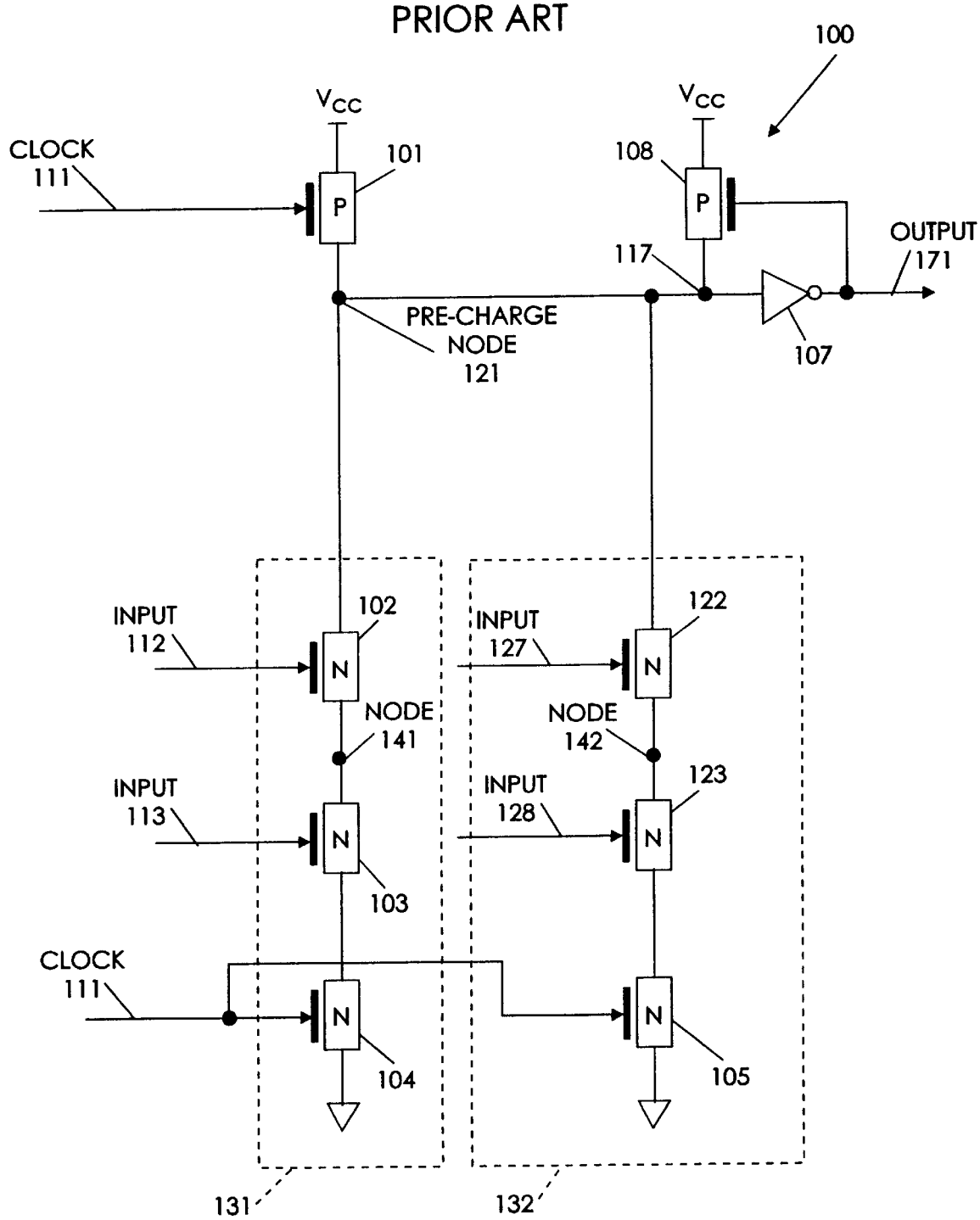
FIG. 1 illustrates a schematic of a conventional dynamic logic circuit.
Figure 2:
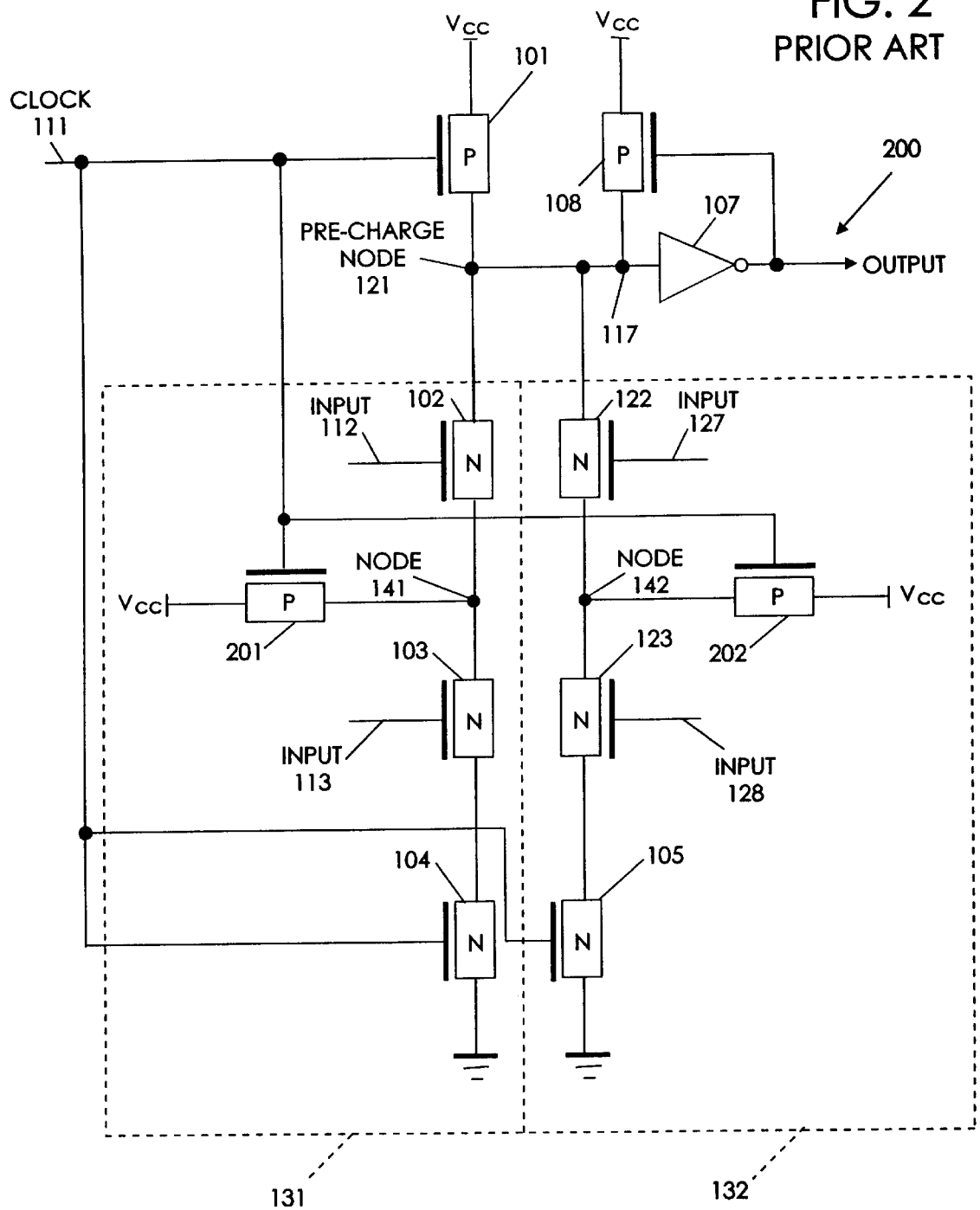
FIG. 2 illustrates a schematic of another conventional dynamic logic circuit.

In the following description, numerous specific details are set forth to provide a thorough understanding of the present invention. However, it will be obvious to those skilled in the art that the present invention may be practiced without such specific details. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 3B:
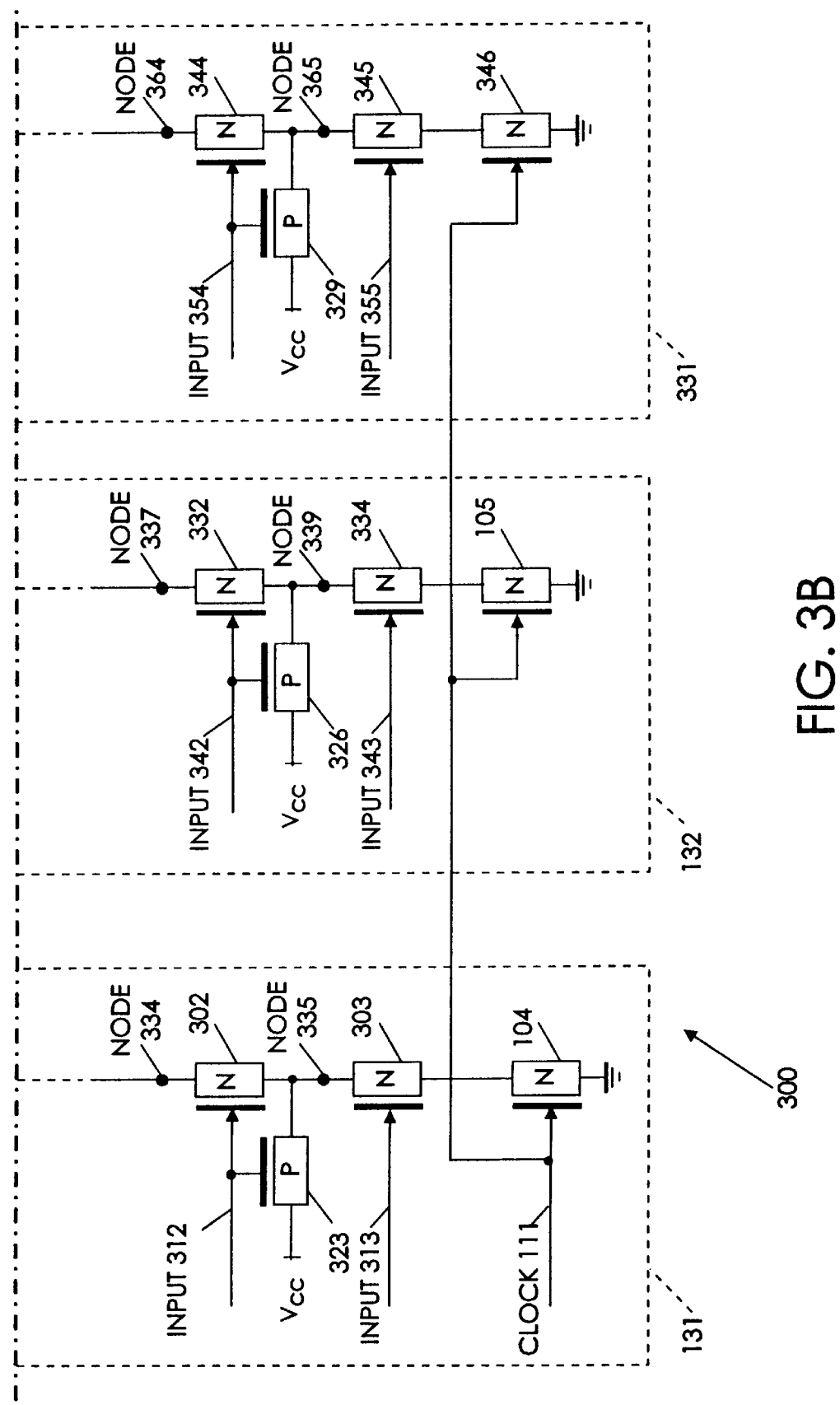
FIG. 3 illustrates a dynamic logic circuit according to an embodiment of the present invention.

An invention that alleviates the charge sharing noise problem in dynamic logic circuitry will now be described in detail. Referring to FIG. 3, there is shown a dynamic logic circuit 300 in accordance with one embodiment of the present invention. During the pre-charge phase of an operating cycle, P-type MOS device 101 charges pre-charge node 121 which is formed by the junction of the drain of MOS device 101 and MOS device stacks, 131, 132, . . . , 331. The input terminal 117 of inverter 107 is also connected to pre-charge node 121. In the pre-charge phase, MOS device 101 is turned on, coupling a supply voltage Vcc to pre-charge node 121, thereby charging pre-charge node 121 to approximately Vcc. The output of inverter 107 forms the output 171 of dynamic logic circuit 300. P-type MOS device 108 forms a weak latch, the gate of MOS device 108 receiving the output 171 of dynamic logic circuit 300, and the drain of MOS device 108 coupled back to the input 117 of inverter 107. The source of MOS device 108 is connected to Vcc.

The state of the output of dynamic logic circuit 300 is determined by the state of one or more MOS device stacks, 131, 132, . . . , 331, during the evaluate phase of the operation of dynamic logic circuit 300. The number of such MOS device stacks may be a pre-determined integer value, N. Each of the MOS device stacks, 131, 132, . . . , 331, includes a plurality of serially connected MOS devices, with the last MOS device in each MOS device stack 131, 132, . . . , 331 being clock foot MOS devices, 104, 105, . . . , 346. The gate of each of clock foot MOS devices 104, 105, . . . 346 receives clock input signal 111, and the source of each of clock foot MOS devices, 104, 105, . . . , 346 is connected to ground. MOS device stacks 131, 132, . . . , 331 include one or more MOS devices serially connected between pre-charge node 121 and clock foot MOS devices 104, 105, . . . , 346, respectively. The number of such serially connected MOS devices need not be the same in each of MOS device stacks 131, 132, . . . , 331. For example, MOS device stack 131 may include K such devices, MOS device 102, MOS device 103, . . . , MOS device 303, where K is a predetermined integer value. Similarly, MOS device stack 132 contains L such serially connected MOS devices, MOS device 122, MOS device 123, . . . , MOS device 339, where L is a predetermined integer value and L need not be equal in value to K. Likewise, MOS device stack 331 contains M such serially connected MOS devices, MOS device 342, MOS device 343, . . . , MOS device 345, where M is a predetermined integer value. M need not be equal to either K or L. It would be understood by one of ordinary skill in the art that an embodiment of the invention may include any combination of values of K, L, M, and N.

During the evaluate phase of operation of dynamic logic circuit 300, pre-charge node 121 may be discharged to ground through its parallel connection to the drains of MOS devices 102, 122, . . . , 342. The state of pre-charge node 121, and consequently the output of dynamic logic circuit 300, depends on the state, "ON" or "OFF," of MOS devices 102, 103, . . . , 303, 122, 123, . . . , 339, . . . ,342, 343, . . . , 345. The state of MOS devices, 102, 103, . . . , 303, 122, 123, . . . , 339, . . . ,342, 343, . . . , 345 is determined by the state of the signal at their respective inputs, 112, 113, . . . , 313, 127, 128, . . . , 343, . . . , 352, 353, . . . , 355. Thus, if during the evaluate phase, when clock input 111 is high, if all of the serially connected MOS devices in one of MOS device stacks 131, 132, . . . , 331, are ON, pre-charge node 121 will discharge to ground during the evaluate phase. Then, the output 171 of dynamic logic circuit 300 will be high, the logic low state of pre-charge node 121 being inverted by inverter 107. Conversely, if at least one of the serially connected MOS devices, 102, 103, . . . , 303, 122, 123, . . . , 339, . . . ,342, 343, . . . , 345, in each of MOS device stack 131, 132, . . . , 331, is OFF, then pre-charge node 121 will remain high during the evaluate phase, and the output of dynamic logic circuit 300 will remain low.

In order to eliminate charge sharing noise, P-type MOS devices 321, . . . , 322, . . . , 323, 324, 325, . . . , 326, . . . 327, 328, . . . , 329 are employed. These MOS devices are complementary to the stack MOS devices with which they are associated. Therefore, when the input signal to one of the stack MOS devices 102, 103, . . . , 303, 122, 123, . . . , 339, . . . , 342, 343, . . . , 345 is such that the stack MOS device is turned ON, the MOS device associated with it that is employed to eliminate the charge sharing noise, one of 321, . . . , 322, . . . , 323, 324, 325, . . . , 326, . . . ,327, 328, . . . , 329 respectively, is turned OFF, and vice versa. Thus, during the pre-charge phase of operation of dynamic logic circuit 300, the inputs to each of the stack MOS devices, 112, 113 . . . , . . . ,312, . . . , 352, 353, . . . , 354, are such that the corresponding stack MOS devices, 102, 103, . . . , 302, . . . , 122, 123, . . . , 332,. . . , 342, 343, . . . , 344, are turned OFF. The associated MOS devices employed to cancel the charge sharing noise, MOS devices 321, 322, . . . , 323, 324, 325, . . . , 326, . . . ,327, 328, . . . , 329, are turned ON, thereby coupling the supply voltage Vcc to nodes 141, 333, . . . , 335, 142, 336, . . . , 338, . . . , 362, 363, . . . , 365 respectively. Each of the MOS device stacks 131, 132, . . . , 331 includes a terminating MOS device, 303, 339, . . . , 345 that do not require devices to eliminate charge sharing noise because the source terminals of terminating MOS devices 303, 339, . . . , 345 are coupled to ground by their respective clock foot MOS devices, 104, 105, . . . , 346.

After the commencement of the evaluate phase of operation of dynamic logic circuit 300, nodes 141, 333, . . . , 335, 142, 336, . . . , 338, . . . , 362, 363, . . . , 365 remain charged because of their coupling to supply voltage Vcc. A node can only begin to discharge after it is decoupled from supply voltage Vcc. This can only happen after its corresponding MOS device employed for eliminating the charge sharing noise turns off. But this can only occur on a change of state, from low to high, of the input to the stack MOS device with which such a noise eliminating MOS device is associated. Consequently, the nodes between stack MOS devices remain fully charged, independent of the delay between the transition of the input signals, and the start of the evaluate phase of operation.

When an input changes state, the corresponding node is disconnected from supply voltage Vcc and it is free to assume a state as defined by the inputs to each of the stack MOS devices in its respective stack. However, unlike the prior art, because each node is coupled to supply voltage Vcc until its corresponding input transitions, it is not susceptible to leakage. Thus, pre-charge node 121 does not have to share its charge with the nodes between stack MOS devices. Moreover, because each of these nodes is pre-charged to the potential of supply voltage Vcc, pre-charge node 121 does not have to charge any stray capacitances that may be associated with these nodes. In this way, MOS devices 321, 322, . . . , 323, 324, 325, . . . , 326, . . . , 327, 328, . . . , 329, eliminate charge sharing noise. This may be more easily understood by referring now to FIG. 4.

Figure 4:
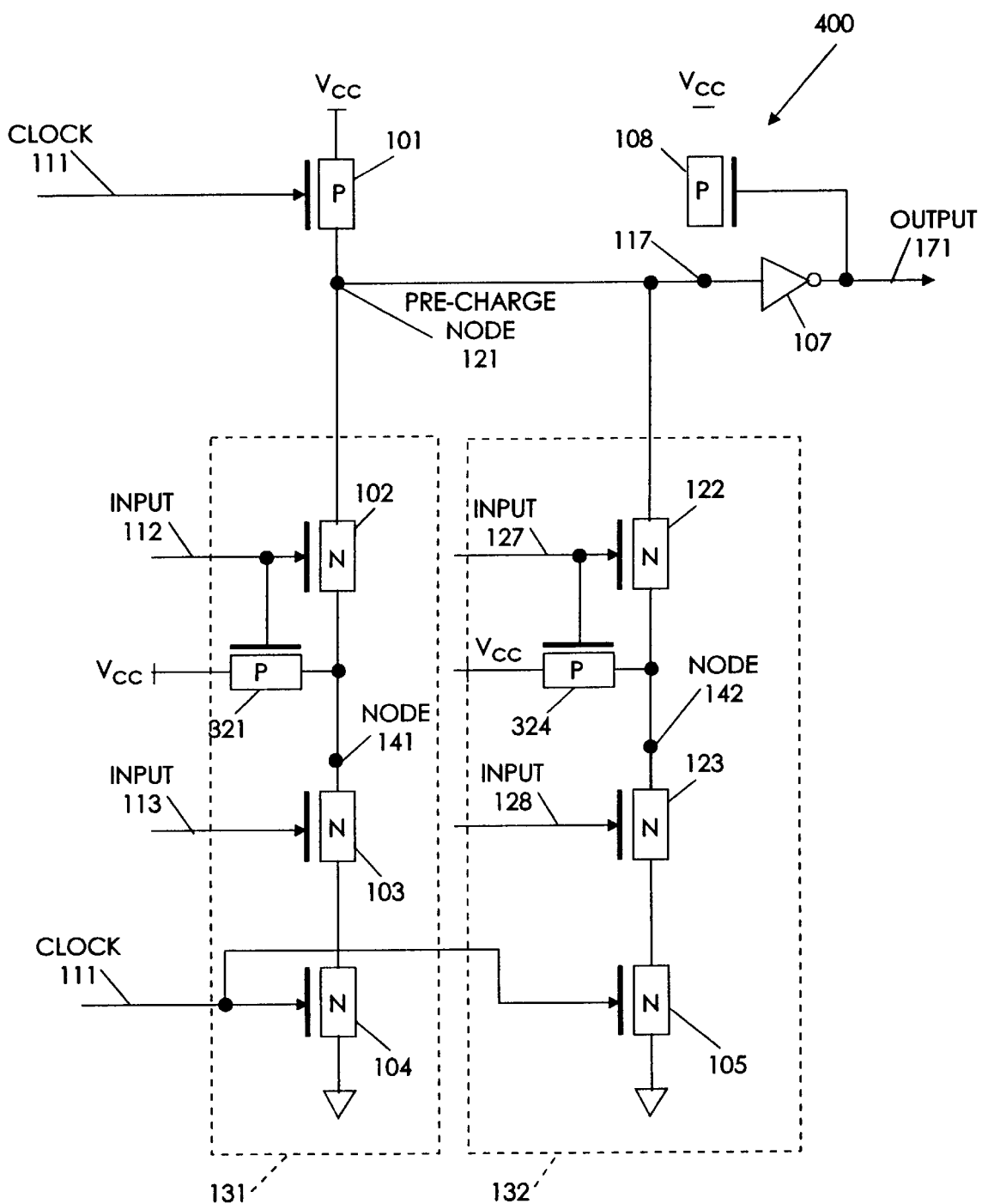
FIG. 4 illustrates a schematic of another embodiment of a dynamic logic circuit according to the present invention.

In FIG. 4, there is depicted another embodiment of dynamic logic circuitry 400, in which only two stacks, 131 and 132 are employed, and each of stacks 131 and 132 includes only two stack MOS devices, 102, 103, and 122 and 123, respectively. This dynamic logic circuit 400 requires only two MOS devices employed to eliminate charge sharing noise, 321 and 324. MOS stack devices 102, 103, 122 and 123 are depicted as N-type devices, and the associated MOS devices employed to eliminate charge sharing, 321 and 324 are correspondingly P-type devices. During the pre-charge phase, clock 111 is low, turning on MOS device 101, charging pre-charge node 121 to approximately the supply voltage Vcc. The inputs 112 and 127 also are low, thereby turning off MOS devices 102 and 122, respectively. Conversely, MOS devices 321 and 324 are turned on, thereby charging nodes 121 and 142 to the supply voltage Vcc. During the succeeding evaluate phase, clock 111 transitions high, turning off MOS device 101. The state of pre-charge node 121 is then determined by the states of the MOS devices in MOS device stacks 131 and 132. The bottom of these stacks is grounded by virtue of clock foot devices 104 and 105 being in the ON state as a consequence of clock signal 111 being high.

If, during the evaluate phase, either or both of inputs 112 and 127 transition high, their respective MOS devices, 102 and 122, turn ON. This couples pre-charge node 121 to either node 141, 142, or both. Contemporaneously with the transition of input 112, 127, or both, to the high state, MOS devices 321, 324, or both, depending on the state of their respective inputs 112 and 127, turn OFF, thereby decoupling either node 141, 142 or both from supply voltage Vcc. Then, the state of pre-charge node 121 and thereby the output 171 of dynamic circuit device 400 is determined by the state of the inputs, 113 and 128 to MOS devices 103 and 123. If either input 113 or input 128 transitions high during the evaluate phase, their respective stack MOS devices 103 and 123 turn ON, coupling node 141, 142, or both to ground by virtue of clock foot MOS devices 104 and 105 being in the ON state. Then, pre-charge node 121 is discharged to ground because of its coupling to either node 141, 142, or both, resulting from the low to high transition at either input 112, 127, or both. But, until this transition from low to high at input 112 occurs, node 141 remains coupled to supply voltage Vcc and cannot discharge. Similarly, node 142 remains coupled to supply voltage Vcc until input 127 transitions from low to high. Thus, whenever pre-charge node 121 is coupled to either node 141, 142 or both, nodes 141 and 142 have themselves been pre-charged to approximately supply voltage Vcc. As a consequence, pre-charge node 121 does not have to charge any stray capacitances associated with node 141 or 142, and any leakage current that might otherwise be drained off nodes 141 or node 142 is supplied by the power supply providing supply voltage Vcc. Therefore, charge sharing noise at pre-charge node 121, and consequently in the output 171 of dynamic logic circuit 400, has been eliminated.

It will be understood by one of ordinary skill in the art that the functioning of a dynamic logic circuit employing a predetermined number of stacks N (as in dynamic logic circuit 300 of FIG. 3), and where each such stack includes predetermined numbers of stack MOS devices (such as K, L, and M in dynamic logic circuit 300 of FIG. 3), is exactly the same as the functioning of dynamic logic circuit 400 of FIG. 4.

It would also be understood by one of ordinary skill in the art that a MOS device structure formed from a pair of complementary MOS devices such as MOS device 102 and MOS device 321 of FIG. 3 could be used as building blocks in any dynamic logic circuit susceptible to charge sharing noise.

Although the present invention and its advantages have been described in detail, it should be understood that various changes, substitutions and alterations can be made herein without departing from the spirit and scope of the invention as defined by the appended claims.

What is claimed is:

1. A dynamic logic circuit comprising:

a precharge metal-oxide semiconductor ("MOS") device having a source terminal coupled to a first voltage potential, and a gate terminal for receiving a clock signal;

one or more MOS device stacks, each of said one or more MOS device stacks including a plurality of serially connected MOS devices, wherein a first one of said plurality of serially connected MOS devices of said each of said one or more MOS device stacks has a drain terminal connected to a drain terminal of said precharge MOS device, forming a precharge node thereby, each of said plurality of serially connected MOS devices of said each of said one or more MOS device stacks having a gate terminal adapted for receiving an input signal, and wherein a terminating one of said plurality of serially connected MOS devices of said each of said one or more MOS device stacks has a source terminal connected to a second voltage potential; and circuitry for charging one or more nodes between said serially connected MOS devices of one or more of said each of said MOS device stacks until an associated one of said input signals changes logic state during an evaluate phase of said clock signal.

2. The dynamic logic circuit of claim 1 wherein said circuitry for charging one or more nodes between said serially connected MOS devices of one or more of said each of said MOS device stacks until an associated one of said input signals changes logic state during an evaluate phase of said clock signal comprises one or more node-charge MOS devices associated with selected ones of said plurality of serially connected MOS devices of said one or more of said each of said one or more MOS device stacks, each of said one or more node-charge MOS devices having (1) a drain terminal connected to a source terminal of an associated one of said plurality of serially connected MOS devices of said one or more of said each of said one or more MOS device stacks, (2) a gate terminal connected to a gate terminal of said associated one of said plurality of serially connected MOS devices of said one or more of said each of said one or more MOS device stacks, and (3) a source terminal connected to said first voltage potential.

3. The dynamic logic circuit of claim 1 wherein said input signal of said terminating one of said plurality of serially connected MOS devices of said each of said one or more MOS device stacks is said clock signal.

4. The dynamic logic circuit of claim 3 wherein said each of said plurality of serially connected MOS devices of said each of said one or more MOS device is an N-type MOS device.

5. The dynamic logic circuit of claim 4 wherein each of said one or more node-charge MOS devices is a P-type MOS device.

6. The dynamic logic circuit of claim 4 wherein said precharge MOS device comprises a P-type MOS device.

7. A dynamic logic circuit comprising:

a precharge MOS device having a source terminal coupled to a supply voltage, and a gate terminal adapted for receiving a clock signal;

one or more MOS device stacks, each of said one or more MOS device stacks including a plurality of serially connected MOS devices, each of said plurality of serially connected MOS devices of said each of said one or more of MOS device stacks having a gate terminal adapted for receiving an input signal, said plurality of serially connected MOS devices of said each of said one or more MOS device stacks including (1) a first MOS device having a drain terminal connected to a drain terminal of said precharge MOS device, (2) an end MOS device, (3) one or more serially connected interior MOS devices, and (4) a clock foot MOS device having a drain terminal coupled to a source terminal of said end MOS device of each of said plurality of serially connected MOS devices of said each of said one or more of MOS device stacks and a source terminal connected to a second voltage potential, said input signal of said clock foot MOS device of said plurality of serially connected MOS devices of said each of said one or more MOS device stacks being said clock signal, wherein said one or more serially connected interior MOS devices of said plurality of serially connected MOS devices of said each of said one or more of MOS device stacks has a drain terminal connected to a source terminal of a previous one of said plurality of serially connected MOS devices of said each of said one or more MOS device stacks and a source terminal connected to a drain terminal of a subsequent one of said plurality of serially connected MOS devices of said each of said one or more of MOS device stacks; and a first circuit for charging a node between an associated one of said first MOS devices of said plurality of serially connected MOS devices of said each of said one or more MOS device stacks and a subsequent one of said plurality of serially connected MOS devices of said each of said one or more MOS device stacks.

8. The dynamic logic circuit of claim 7 further comprising a second circuit for charging a node between an associated one of each of said one or more serially connected interior MOS devices of said plurality of serially connected MOS devices of said each of said one or more MOS device stacks and a subsequent one of said one or more serially connected interior MOS devices of said plurality of serially connected MOS devices of said each of said one or more MOS device stacks.

9. The dynamic logic circuit of claim 8 wherein said first circuit for charging said node between said associated one of said first MOS devices of said plurality of serially connected MOS devices of said each of said one or more MOS device stacks and said subsequent one of said one or more serially connected MOS devices of said each of said one or more MOS device stacks comprises a first one or more node-charge MOS devices associated with each of said first MOS devices of said plurality of serially connected MOS devices of said each of said one or more MOS device stacks, wherein each of said first one or more node-charge MOS devices has a source terminal coupled to said supply voltage, a drain terminal coupled to a source terminal of said associated one of said first MOS devices of said plurality of serially connected MOS devices of said each of said one or more MOS device stacks, and a gate terminal coupled to said gate terminal of said associated one of said first MOS devices of said one or more serially connected MOS devices of said each of said one or more MOS device stacks, and said second circuit for charging a node between an associated one of each of said one or more serially connected interior MOS devices of said plurality of serially connected MOS devices of said each of said one or more MOS device stacks and a subsequent one of said one or more serially connected interior MOS devices of said plurality of serially connected MOS devices of said each of said one or more MOS device stacks comprises a second one or more node-charge MOS devices associated with each of said one or more serially connected interior MOS devices of said plurality of serially connected MOS devices of said one of said one or more MOS device stacks, wherein each of said second one or more node-charge MOS devices has a source terminal coupled to said supply voltage, a drain terminal coupled to a source terminal of an associated one of said one or more serially connected interior MOS devices of said one or more serially connected MOS devices of said one of said one or more MOS device stacks, and a gate terminal coupled to said gate terminal of said associated one of said one or more serially connected interior MOS devices of said one or more serially connected MOS devices of said one of said one or more MOS device stacks.

10. The dynamic logic circuit of claim 9 wherein each of said one or more clock foot MOS devices of said plurality of serially connected MOS devices of said each of said one or more MOS device stacks devices is an N-type MOS device.

11. The dynamic logic circuit of claim 9 wherein said first one or more node-charge MOS devices associated with each of said first one of said serially connected MOS devices of said each of said one or more MOS device stacks comprises two MOS devices associated with each of said first one of said serially connected MOS devices of said each of said one or more MOS device stacks.

12. The dynamic logic circuit of claim 11 wherein said first one or more node-charge MOS devices associated with each of said first one of said serially connected MOS devices of said each of said one or more MOS device stacks comprises two P-type MOS devices associated with each of said first one of said serially connected MOS devices of said each of said one or more MOS device stacks.

13. A dynamic logic circuit comprising: circuitry for precharging a precharge node;
- a first NFET having (1) a drain terminal connected to said precharge node and (2) a gate terminal adapted for receiving a first input signal;
- a second NFET having (1) a drain terminal connected to said precharge node and (2) a gate terminal adapted for receiving a second input signal;
- a third NFET having (1) a drain terminal connected to a source terminal of said first NFET, and (2) a gate terminal connected to a third input;
- a fourth NFET having (1) a drain terminal connected to a source terminal of said second NFET, and (2) a gate terminal connected to a fourth input; and
- two node-charge devices wherein a first one of said two node-charge devices has (1) a drain terminal connected to said source terminal of said first NFET, (2) a gate terminal connected to said gate terminal of said first NFET and (3) a source terminal connected to a voltage potential, a second one of said two node-charge devices has (1) a drain terminal connected to said source terminal of said second NFET, (2) a gate terminal connected to said gate terminal of said second NFET and (3) a source terminal connected to said voltage potential.

14. The dynamic logic circuit of claim 13 wherein each of said two node-charge devices comprises a PFET.

* * * * *